(12) United States Patent
Shimomura et al.

(10) Patent No.: US 11,569,433 B2
(45) Date of Patent: Jan. 31, 2023

(54) ACOUSTIC WAVE RESONATOR, FILTER, AND MULTIPLEXER

(71) Applicant: TAIYO YUDEN CO., LTD., Tokyo (JP)

(72) Inventors: Hikaru Shimomura, Tokyo (JP); Naoki Takahashi, Tokyo (JP); Yuki Endo, Tokyo (JP); Kota Okubo, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 1358 days.

(21) Appl. No.: 15/922,685

(22) Filed: Mar. 15, 2018

(65) Prior Publication Data

US 2018/0294402 A1 Oct. 11, 2018

(30) Foreign Application Priority Data

Apr. 7, 2017 (JP) .............................. JP2017-076916

(51) Int. Cl.
*H03H 9/145* (2006.01)
*H01L 41/09* (2006.01)
(Continued)

(52) U.S. Cl.
CPC ............ *H01L 41/09* (2013.01); *H01L 41/047* (2013.01); *H03H 9/14582* (2013.01);
(Continued)

(58) Field of Classification Search
CPC .... H03H 9/6483; H03H 9/56; H03H 9/14538; H03H 9/14535; H03H 9/14517; H03H 9/14541; H03H 9/14532; H03H 9/14582
See application file for complete search history.

(56) References Cited

U.S. PATENT DOCUMENTS 6,583,691 B2 * 6/2003 Takamine ............ H03H 9/6436
333/195
10,389,391 B2 * 8/2019 Ito ...................... H03H 9/02685
(Continued)

FOREIGN PATENT DOCUMENTS

CN 1340916 A 3/2002
CN 1870425 A 11/2006
(Continued)

OTHER PUBLICATIONS

Japanese Office Action dated Jan. 12, 2021, in a counterpart Japanese patent application No. 2017-076916. (A machine translation (not reviewed for accuracy) attached.).
(Continued)

*Primary Examiner* — J. San Martin
(74) *Attorney, Agent, or Firm* — Chen Yoshimura LLP

(57) ABSTRACT

An acoustic wave resonator includes: a piezoelectric substrate; and an interdigital transducer (IDT) located on the piezoelectric substrate, the IDT including a pair of comb-shaped electrodes having a plurality of electrode fingers and a bus bar to which the plurality of electrode fingers are coupled, the IDT having: a first region in which a pitch of electrode fingers is substantially constant; a second region in which a pitch of electrode fingers decreases at closer distances to an outer side; and a third region in which a pitch of electrode fingers increases at closer distances to an outer side, the second region being located outside the first region in an arrangement direction of the plurality of electrode fingers, and the third region being located outside the second region in the arrangement direction.

10 Claims, 11 Drawing Sheets

(51) Int. Cl.
  *H04J 1/04*    (2006.01)
  *H03H 9/56*    (2006.01)
  *H01L 41/047*  (2006.01)
  *H03H 9/64*    (2006.01)

(52) U.S. Cl.
  CPC ............ *H03H 9/56* (2013.01); *H03H 9/6483* (2013.01); *H04J 1/045* (2013.01)

(56) References Cited

U.S. PATENT DOCUMENTS

| | | |
|---|---|---|
| 10,511,283 B2* | 12/2019 | Maeda ............... H03H 9/02937 |
| 2002/0021195 A1 | 2/2002 | Takamine |
| 2003/0231083 A1 | 12/2003 | Detlefsen |
| 2005/0035831 A1 | 2/2005 | Kawachi et al. |
| 2005/0190014 A1 | 9/2005 | Saitou et al. |
| 2005/0212621 A1 | 9/2005 | Takamine |
| 2007/0024397 A1* | 2/2007 | Otsuka ................. H03H 9/6469 333/195 |
| 2009/0108960 A1* | 4/2009 | Igaki ..................... H03H 9/6483 333/195 |
| 2010/0102901 A1 | 4/2010 | Tsuda |
| 2012/0032753 A1 | 2/2012 | Nishimura et al. |
| 2012/0188026 A1 | 7/2012 | Yamaji et al. |
| 2014/0159833 A1 | 6/2014 | Ikeuchi et al. |
| 2016/0380176 A1 | 12/2016 | Kishino |
| 2020/0212890 A1* | 7/2020 | Uesaka ............. H03H 9/02637 |

FOREIGN PATENT DOCUMENTS

| | | |
|---|---|---|
| CN | 101729040 A | 6/2010 |
| JP | 2003-188674 A | 7/2003 |
| JP | 2003-258595 A | 9/2003 |
| JP | 2005-176254 A | 6/2005 |
| JP | 2005-244669 A | 9/2005 |
| JP | 2005-295203 A | 10/2005 |
| JP | 2012-138964 A | 7/2012 |
| JP | 2012-156741 A | 8/2012 |
| JP | 2013-168996 A | 8/2013 |
| WO | 2015/080278 A1 | 6/2015 |
| WO | 2013/136757 A1 | 8/2015 |

OTHER PUBLICATIONS

Chinese Office Action dated Jan. 19, 2022 in a counterpart Chinese patent application No. 201810295377.2. (A machine translation (not reviewed for accuracy) attached.).

Chinese Office Action dated Jun. 25, 2021, in a counterpart Chinese patent application No. 201810295377.2. (A machine translation (not reviewed for accuracy) attached.).

* cited by examiner

FIRST COMPARATIVE EXAMPLE

SECOND COMPARATIVE EXAMPLE

THIRD COMPARATIVE EXAMPLE

FIRST EMBODIMENT

FIG. 4A
FIRST COMPARATIVE EXAMPLE

| SAMPLE | PITCH P0 | NUMBER OF PAIRS |
|---|---|---|
| 1 | 2.000 μm | 80 PAIRS |

FIG. 4B
SECOND COMPARATIVE EXAMPLE

| SAMPLE | FIRST REGION 52 | | SECOND REGION 54 | |
|---|---|---|---|---|
| | PITCH P0 | NUMBER OF PAIRS | PITCH CHANGE RATE | NUMBER OF PAIRS |
| 2A | 2.000 μm | 71 PAIRS | 3% | 9 PAIRS |
| 2B | 2.000 μm | 73 PAIRS | 4% | 7 PAIRS |
| 2C | 2.000 μm | 75 PAIRS | 5% | 5 PAIRS |

FIG. 4C
THIRD COMPARATIVE EXAMPLE

| SAMPLE | FIRST REGION 52 | | SECOND REGION 54 | | THIRD REGION 56 | |
|---|---|---|---|---|---|---|
| | PITCH P0 | NUMBER OF PAIRS | PITCH CHANGE RATE | NUMBER OF PAIRS | PITCH CHANGE RATE | NUMBER OF PAIRS |
| 3A | 2.000 μm | 71 PAIRS | 3% | 4.5 PAIRS | 3% | 4.5 PAIRS |
| 3B | 2.000 μm | 73 PAIRS | 4% | 3.5 PAIRS | 4% | 3.5 PAIRS |
| 3C | 2.000 μm | 75 PAIRS | 5% | 2.5 PAIRS | 5% | 2.5 PAIRS |

FIG. 4D
FIRST EMBODIMENT

| SAMPLE | FIRST REGION 52 | | SECOND REGION 54 | | THIRD REGION 56 | |
|---|---|---|---|---|---|---|
| | PITCH P0 | NUMBER OF PAIRS | PITCH CHANGE RATE | NUMBER OF PAIRS | PITCH CHANGE RATE | NUMBER OF PAIRS |
| 4A | 2.000 μm | 71 PAIRS | 3% | 4.5 PAIRS | 3% | 4.5 PAIRS |
| 4B | 2.000 μm | 73 PAIRS | 4% | 3.5 PAIRS | 4% | 3.5 PAIRS |
| 4C | 2.000 μm | 75 PAIRS | 5% | 2.5 PAIRS | 5% | 2.5 PAIRS |

ACOUSTIC WAVE RESONATOR, FILTER, AND MULTIPLEXER

CROSS-REFERENCE TO RELATED APPLICATION

This application is based upon and claims the benefit of priority of the prior Japanese Patent Application No. 2017-076916, filed on Apr. 7, 2017, the entire contents of which are incorporated herein by reference.

FIELD

A certain aspect of the present invention relates to an acoustic wave resonator, a filter, and a multiplexer.

BACKGROUND

Surface acoustic wave resonators include: an Interdigital Transducer (IDT) having a plurality of electrode fingers; and reflectors on a piezoelectric substrate. The reflectors reflect the acoustic wave excited by the IDT, thereby confining the acoustic wave in the IDT. It has been known to provide an equal-pitch region in which the pitch of the electrode fingers is constant in the center portion of the IDT and provide graded regions in which the pitch of the electrode fingers gradually decreases at both ends of the IDT as disclosed in, for example, Japanese Patent Application Publication No. 2012-138964 (Patent Document 1).

SUMMARY OF THE INVENTION

According to the first aspect of the present invention, there is provided an acoustic wave resonator including: a piezoelectric substrate; and an interdigital transducer (IDT) located on the piezoelectric substrate, the IDT including a pair of comb-shaped electrodes having a plurality of electrode fingers and a bus bar to which the plurality of electrode fingers are coupled, the IDT having: a first region in which a pitch of electrode fingers is substantially constant; a second region in which a pitch of electrode fingers decreases at closer distances to an outer side; and a third region in which a pitch of electrode fingers increases at closer distances to an outer side, the second region being located outside the first region in an arrangement direction of the plurality of electrode fingers, and the third region being located outside the second region in the arrangement direction.

According to the second aspect of the present invention, there is provided a filter including the above piezoelectric thin film resonator.

According to the third aspect of the present invention, there is provided a multiplexer including the above filter.

BRIEF DESCRIPTION OF THE DRAWINGS

FIG. 4A through FIG. 4D respectively present the simulation conditions for samples of the first through third comparative examples and the first embodiment;

DETAILED DESCRIPTION

The technique disclosed in Patent Document 1 enables to reduce spurious. However, the reduction of spurious by using the method described in Patent Document 1 is insufficient.

Hereinafter, a description will be given of embodiments with reference to the accompanying drawings.

First Embodiment

Figure 1A:
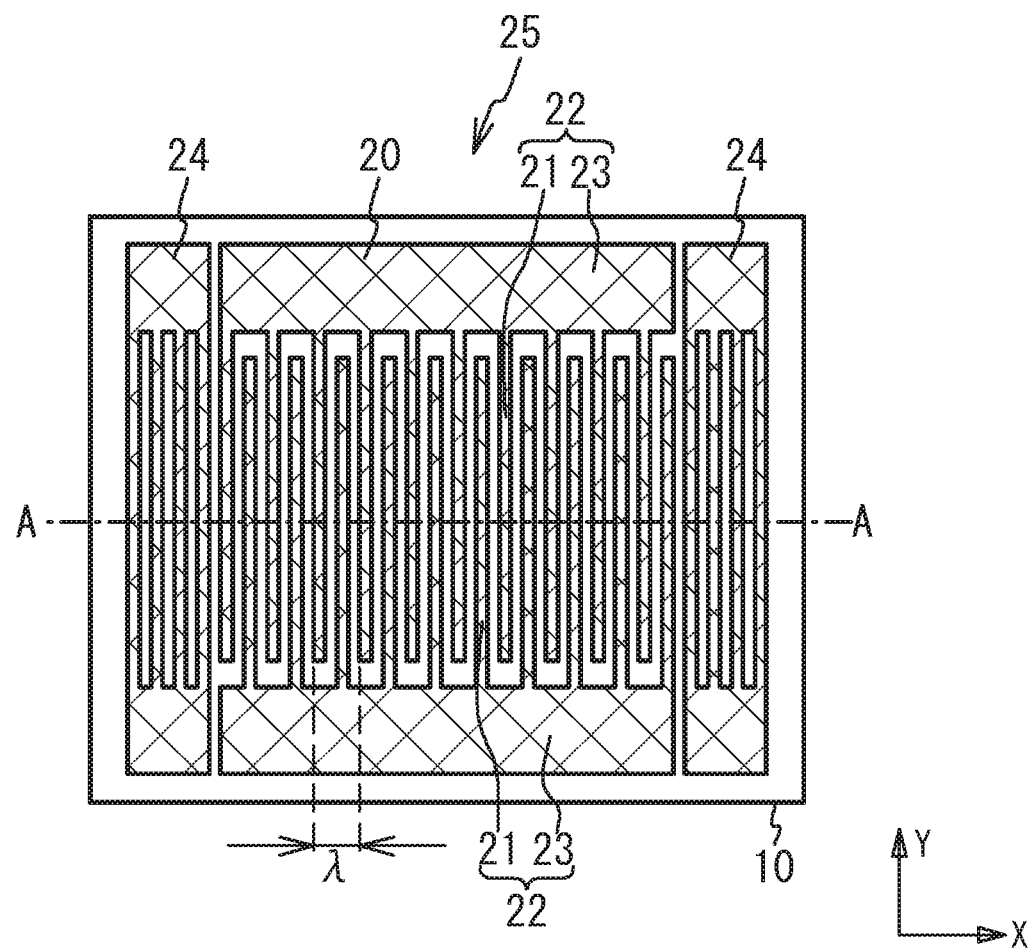
FIG. 1A is a plan view of an acoustic wave resonator in accordance with a comparative example and an embodiment.
Figure 1B:
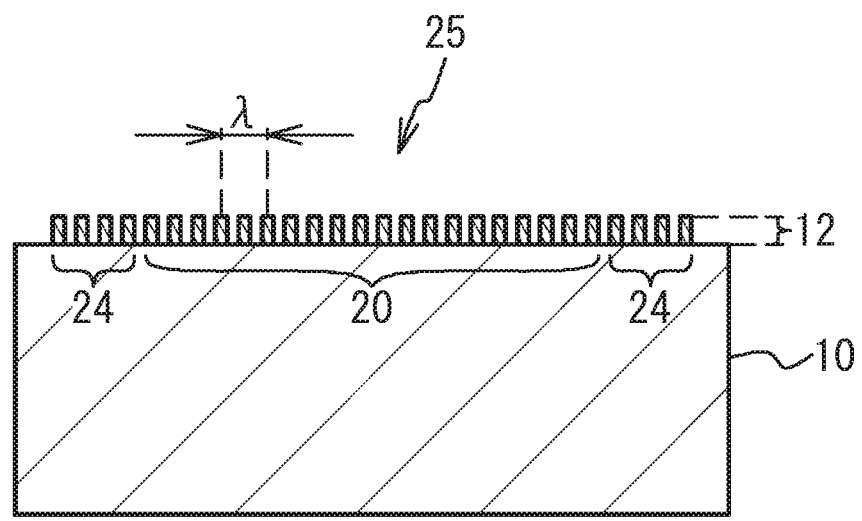
FIG. 1B is a cross-sectional view taken along line A-A in FIG. 1A.

FIG. 1A is a plan view of an acoustic wave resonator in accordance with a comparative example and an embodiment, and FIG. 1B is a cross-sectional view taken along line A-A in FIG. 1A. As illustrated in FIG. 1A and FIG. 1B, a one-port surface acoustic wave resonator 25 includes an IDT 20 and reflectors 24 formed on a piezoelectric substrate 10. The IDT 20 and the reflectors 24 are formed of a metal film 12 formed on the piezoelectric substrate 10. The IDT 20 includes a pair of comb-shaped electrodes 22 facing each other. The comb-shaped electrode 22 includes a plurality of electrode fingers 21 and a bus bar 23 to which the electrode fingers 21 are coupled. A pair of the comb-shaped electrodes 22 are provided so as to face each other so that the electrode fingers 21 of one of the comb-shaped electrodes 22 and the electrode fingers 21 of the other of the comb-shaped electrodes 22 are substantially alternately arranged.

The acoustic wave excited by the electrode fingers 21 of a pair of the comb-shaped electrodes 22 mainly propagates in the arrangement direction of the electrode fingers 21. The propagation direction of the acoustic wave (i.e., the arrangement direction of the electrode fingers 21) is defined as an X direction, and the extension direction of the electrode finger 21 is defined as a Y direction. The X direction and the Y direction do not necessarily correspond to the X-axis orientation and the Y-axis orientation in the crystal orientation of the piezoelectric substrate 10, respectively. The pitch of the electrode fingers 21 of one comb-shaped electrode 22 corresponds to the wavelength λ of the acoustic wave. The reflectors 24 reflect the acoustic wave. Accordingly, the energy of the acoustic wave is confined in the IDT 20. The piezoelectric substrate 10 is, for example, a lithium tantalate substrate or a lithium niobate substrate. The metal film 12 is, for example, an aluminum film or a copper film. A metal film such as a titanium film or a chrome film may be located between the aluminum film or the copper film and the piezoelectric substrate 10. The metal film 12 has a film thickness of, for example, 50 nm to 500 nm, the electrode finger 21 has a width in the X direction of 200 nm to 1500 nm, and the pitch of the electrode fingers 21 is, for example, from 500 nm to 2500 nm. The IDT 20 has an electrostatic capacitance of, for example, 0.1 pF to 10 pF. An insulating film functioning as a protective film or a temperature compensation film may be located on the piezoelectric substrate 10 so as to cover the metal film 12.

The first through third comparative examples and the first embodiment were subject to a simulation. FIG. 2A through FIG. 3B illustrate the pitches of the acoustic wave resonators in accordance with the first through third comparative examples and the first embodiment in the X direction, respectively. In FIG. 2A through FIG. 3B, the upper diagrams are plan views of the acoustic wave resonators, and the lower diagrams illustrate the pitches of the electrode fingers 21 in the X direction.

Figure 2A:
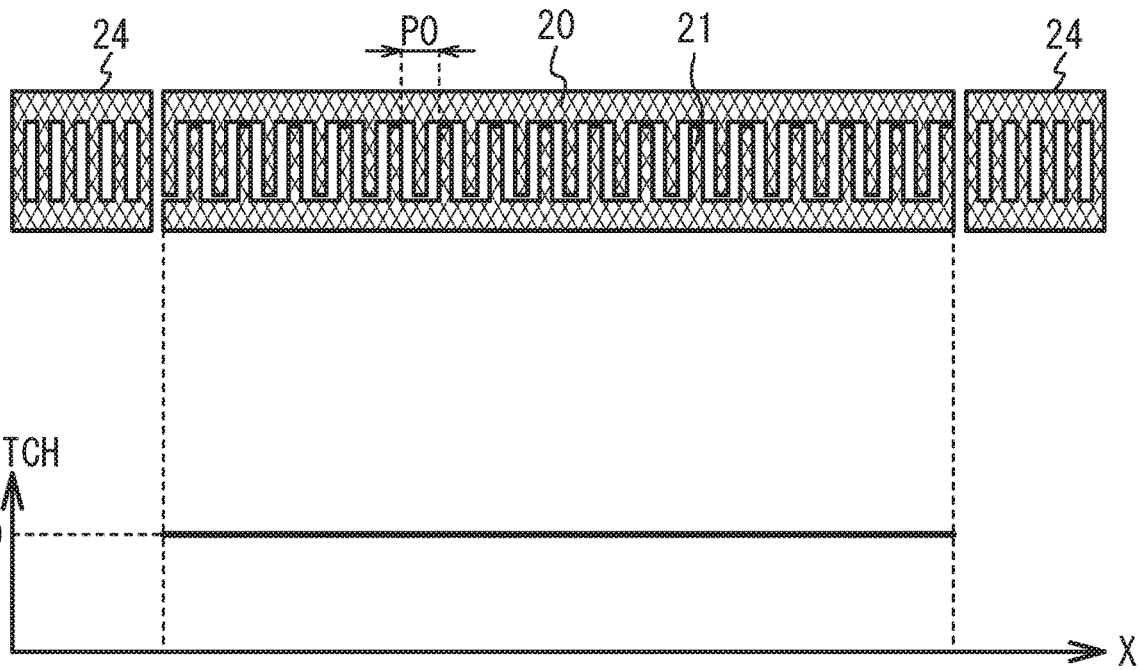
FIG. 2A and FIG. 2B illustrate the pitches of acoustic wave resonators in accordance with first and second comparative examples in an X direction, respectively.
Figure 2B:
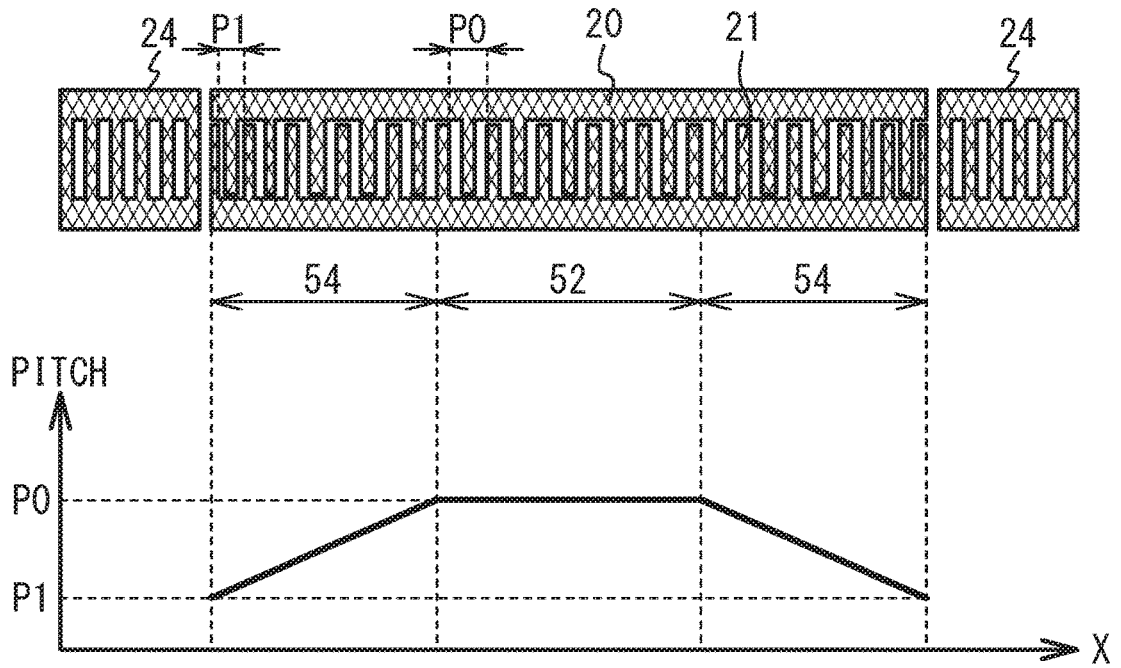

As illustrated in FIG. 2A, in the first comparative example, a pitch P0 in the IDT 20 is constant. As illustrated in FIG. 2B, in the second comparative example, the pitch P0 in a first region 52, which is located in the middle in the X direction, of the IDT 20 is constant. The pitches at both ends of the IDT 20 are P1, and in second regions 54 located at both sides of the first region 52, the pitch decreases at a constant rate from the boundary with the first region 52 to the edge of the second region 54.

Figure 3A:
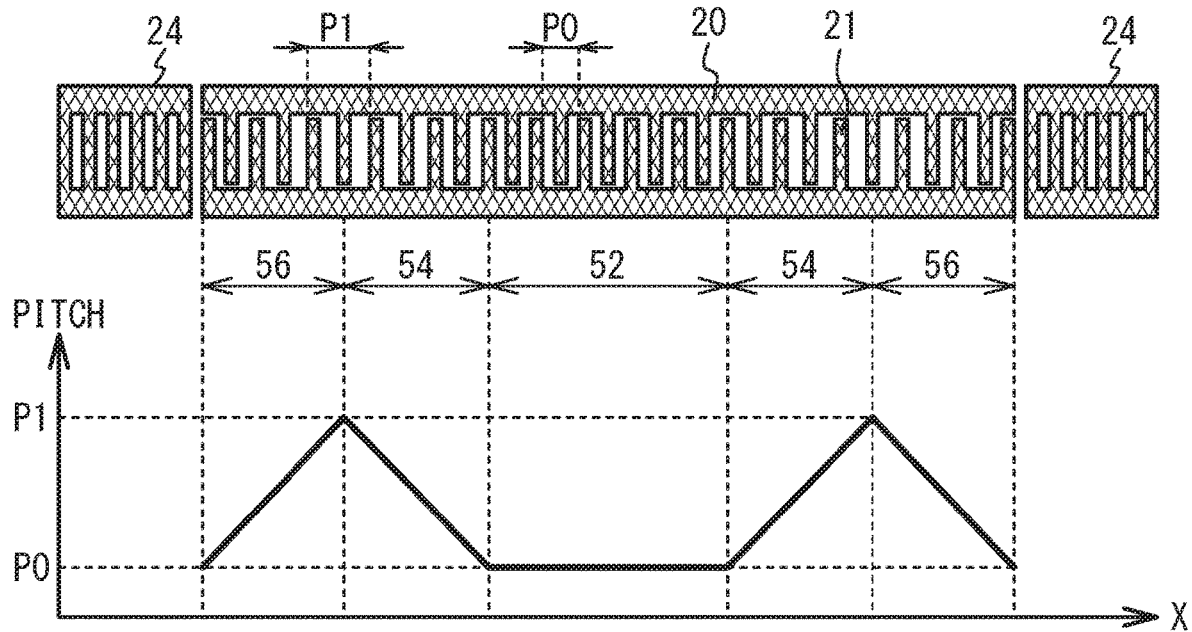
FIG. 3A and FIG. 3B illustrate the pitches of acoustic wave resonators in accordance with a third comparative example and a first embodiment in the X direction, respectively.

As illustrated in FIG. 3A, in the third comparative example, the pitch P0 in the first region 52 is constant. The second regions 54 are located at both sides of the first region 52, and third regions 56 are located outside the second regions 54. The pitch at the boundary between the second region 54 and the third region 56 is P1, and the pitch increases from P0 to P1 at a constant rate at closer distances to the outer side in each of the second regions 54. The pitch at the outer edge of the third region 56 is P0, and the pitch decreases from P1 to P0 at a constant rate at closer distances to the outer side in each of the third regions 56.

Figure 3B:
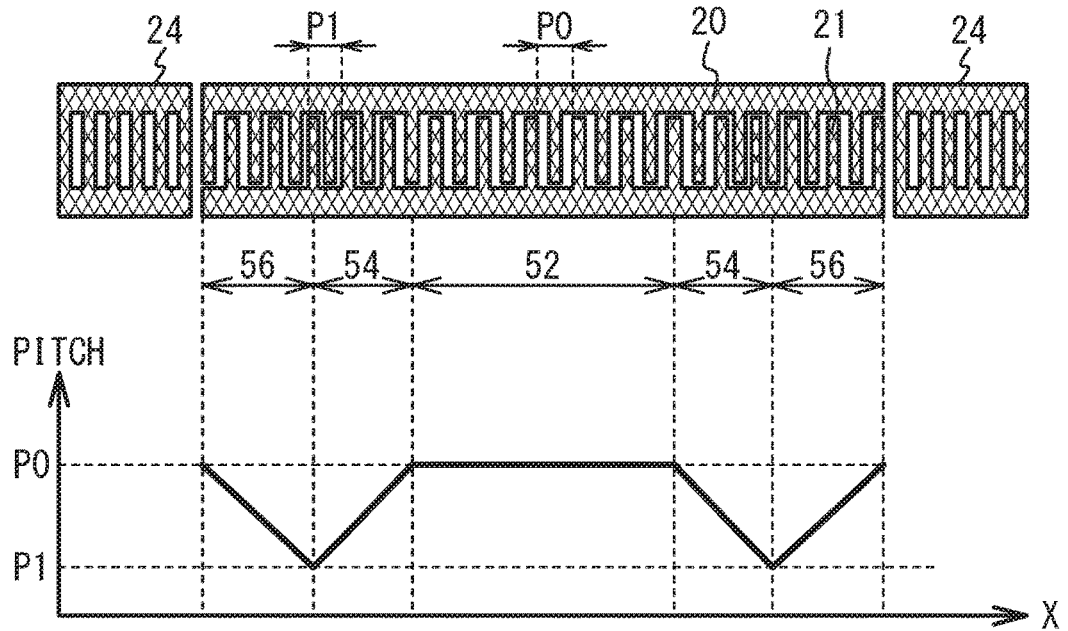

As illustrated in FIG. 3B, in the first embodiment, the pitch P1 is less than P0. In the second region 54, the pitch decreases from P0 to P1 at a constant rate at closer distances to the outer side in the second region 54. The pitch increases from P1 to P0 at a constant rate at closer distances to the outer side of the third region 56 in the third region 56.

The simulation conditions are as follows.
Piezoelectric substrate 10: 48° rotated Y-cut X-propagation lithium tantalate substrate
Metal film 12: Titanium film with a film thickness of 50 nm and an aluminum film with a film thickness of 166 nm stacked in this order from the piezoelectric substrate 10 side
Reflector 24:
  Pitch: 2.125 µm
  Number of pairs: 15 pairs
IDT 20:
  Pitch P0: 2.000 µm
  Duty ratio: 50%
Aperture length: 30 µm (15λ)

FIG. 4A through FIG. 4D present simulation conditions for samples of the first through third comparative examples and the first embodiment, respectively. The pitch change rate is |P0−P1|/P0×100%. The number of pairs in the second region 54 represents the total number of pairs in the second regions 54 located at both sides of the first region 52. The number of pairs in the third region 56 represents the total number of pairs in both the third regions 56. The number of pairs in one of the second regions 54 is equal to the number of pairs in the other of the second regions 54, and the number of pairs in one of the third regions 56 is equal to the number of pairs in the other of the third regions 56. As illustrated in FIG. 4A, in the sample 1 of the first comparative example, the pitch P0 of the IDT 20 is 2 µm, and the number of pairs is 80 pairs.

As presented in FIG. 4B, in the second comparative example, samples 2A through 2C having different pitch change rates and different numbers of pairs in the second region 54 were simulated. The pitch change rate is 3% in the sample 2A, 4% in the sample 2B, and 5% in the sample 2C. Thus, the pitch P1 is 1.94 µm in the sample 2A, 1.92 µm in the sample 2B, and 1.90 µm in the sample 2C. The total number of pairs in the entire IDT is 80 pairs.

As presented in FIG. 4C, in the third comparative example, samples 3A through 3C having different pitch change rates and different numbers of pairs in the second region 54 and the third region 56 were simulated. The pitch change rate in each of the second region 54 and the third region 56 is 3% in the sample 3A, 4% in the sample 3B, and 5% in the sample 3C. Thus, the pitch P1 is 2.06 µm in the sample 3A, 2.08 µm in the sample 3B, and 2.10 µm in the sample 3C.

As presented in FIG. 4D, in the first embodiment, samples 4A through 4C having different pitch change rates and different numbers of pairs in the second region 54 and the third region 56 were simulated. The pitch change rate in each of the second region 54 and the third region 56 is 3% in the sample 4A, 4% in the sample 4B, and 5% in the sample 4C. Accordingly, the pitch P1 is 1.94 µm in the sample 4A, 1.92 µm in the sample 4B, and 1.90 µm in the sample 4C.

Figure 5A:
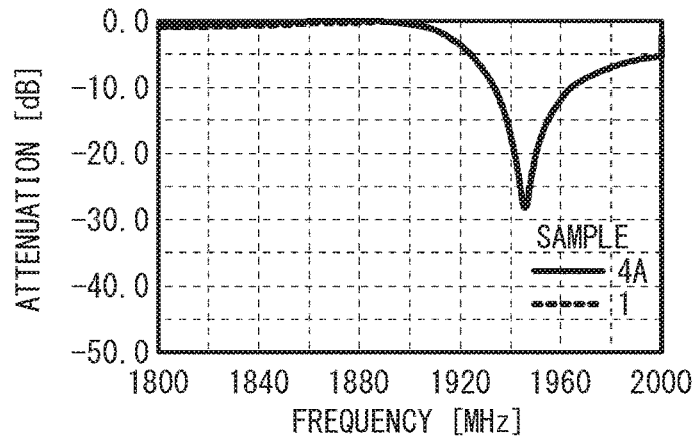
FIG. 5A through FIG. 5D illustrate transmission characteristics of the first comparative example and the first embodiment.
Figure 5B:
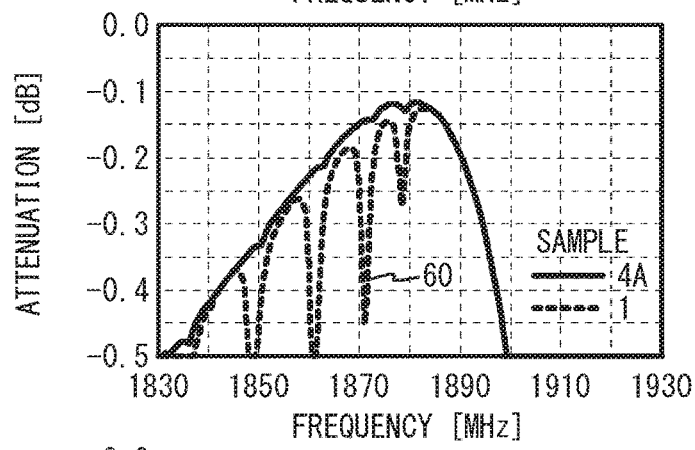
Figure 5C:
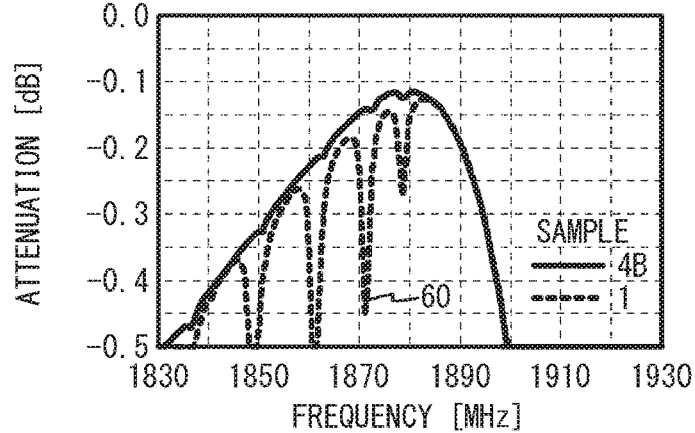
Figure 5D:
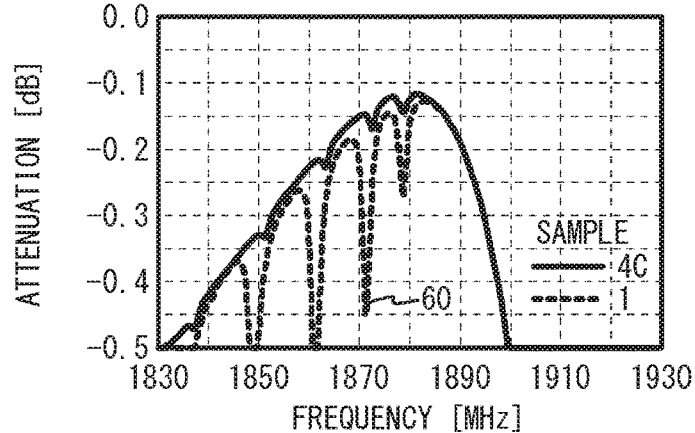

FIG. 5A through FIG. 5D illustrate transmission characteristics of the first comparative example and the first embodiment. FIG. 5A illustrates transmission characteristics of the acoustic wave resonators of the sample 1 and the sample 4A. FIG. 5B through FIG. 5D are enlarged views of transmission characteristics around the resonant frequency of the samples 4A through 4C, respectively.

As demonstrated in FIG. 5A, on this scale, little difference in transmission characteristic exists between the samples 1 and 4A. The resonant frequency is approximately 1880 MHz, and the antiresonant frequency is approximately 1945 MHz.

As demonstrated in FIG. 5B through FIG. 5D, when the transmission characteristic around the resonant frequency is enlarged, in the sample 1, large spurious 60 is observed at frequencies lower than the resonant frequency. In the samples 4A through 4C, spurious 60 is small.

Figure 6A:
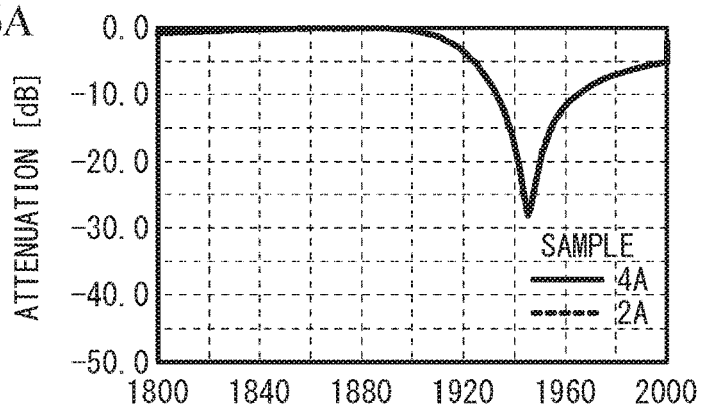
FIG. 6A through FIG. 6D illustrate transmission characteristics of the second comparative example and the first embodiment.
Figure 6B:
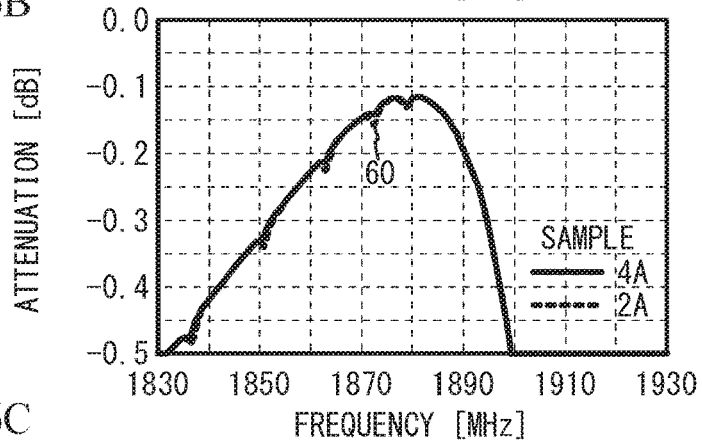
Figure 6C:
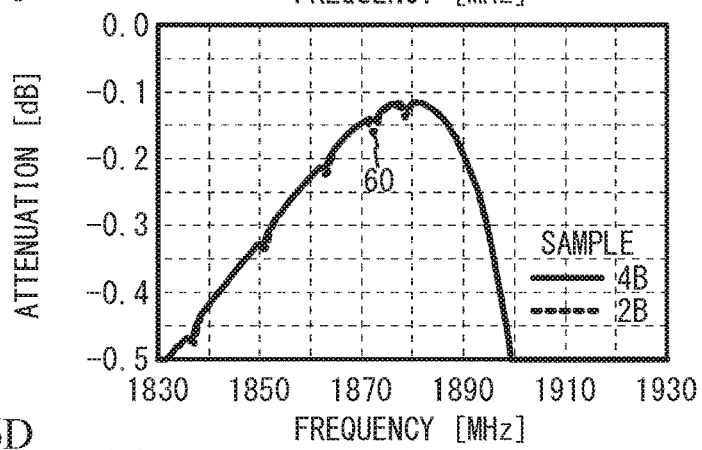
Figure 6D:
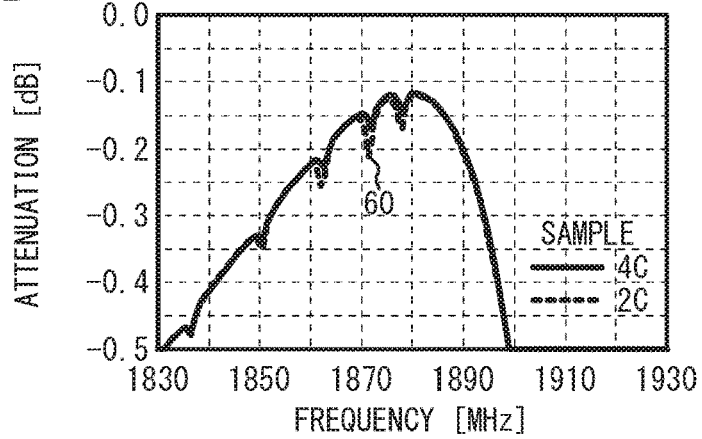

FIG. 6A through FIG. 6D illustrate transmission characteristics of the second comparative example and the first embodiment. FIG. 6A illustrates transmission characteristics of the acoustic wave resonators of the samples 2A and the sample 4A. FIG. 6B through FIG. 6D are enlarged views of transmission characteristics around the resonant frequency of the samples 4A through 4C and 2A through 2C, respectively.

As demonstrated in FIG. 6A, little difference in transmission characteristic exists between the samples 2A and 4A, the resonant frequency is approximately 1880 MHz, and the antiresonant frequency is approximately 1945 MHz.

As demonstrated in FIG. 6B through FIG. 6D, spurious 60 of the samples 2A through 2B is smaller than that of the sample 1 of FIG. 5B through FIG. 5D. Spurious 60 of the samples 4A through 4C is further smaller than those of the samples 2A through 2C.

Figure 7A:
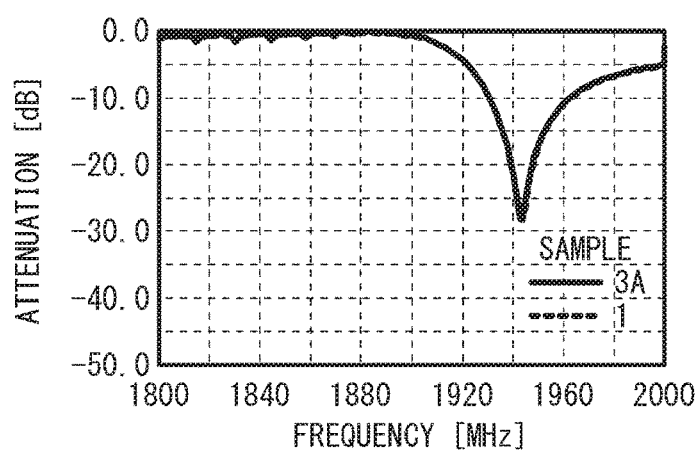
FIG. 7A through FIG. 7D illustrate transmission characteristics of the first comparative example and the third comparative example.
Figure 7B:
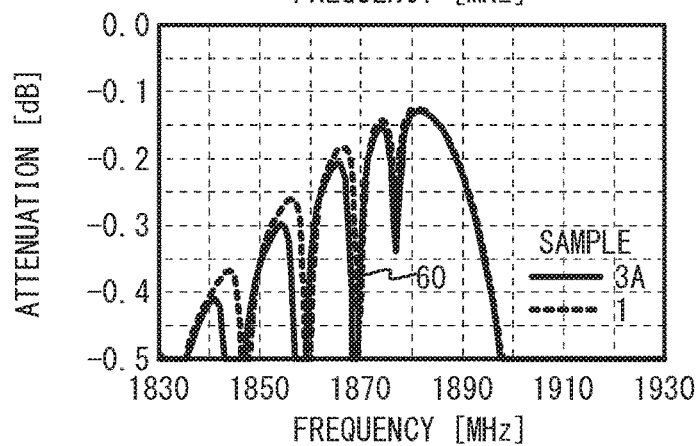
Figure 7C:
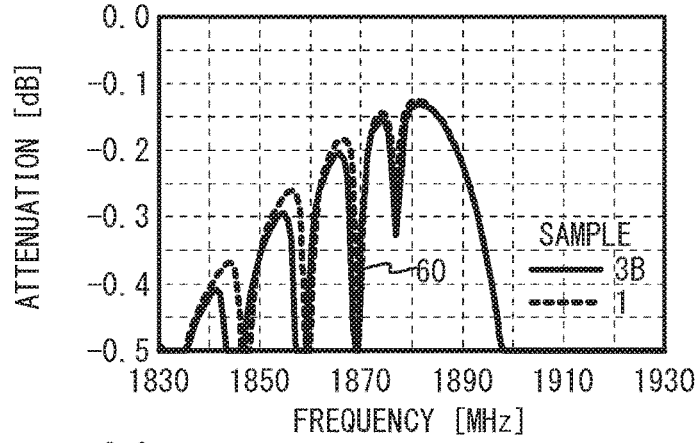
Figure 7D:
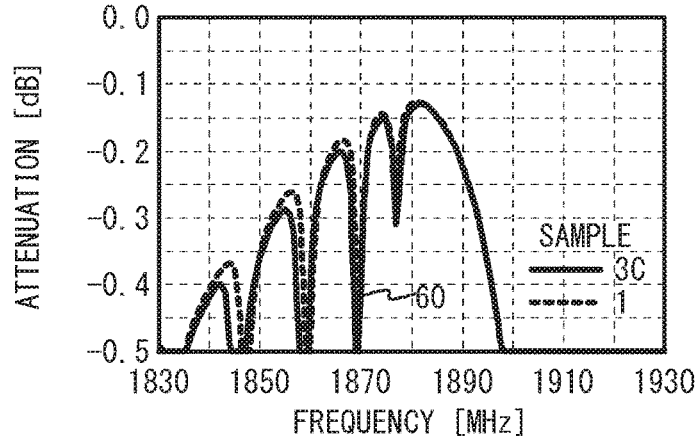

FIG. 7A through FIG. 7D illustrate transmission characteristics of the first comparative example and the third comparative example. FIG. 7A illustrates transmission characteristics of the acoustic wave resonators of the sample 1 and the sample 3A. FIG. 7B through FIG. 7D are enlarged views of transmission characteristics around the resonant frequency of the samples 3A through 3C, respectively.

As demonstrated in FIG. 7A, in the sample 3A, spurious is observed at frequencies lower than the resonant frequency. The resonant frequency is approximately 1880 MHz, and the antiresonant frequency is approximately 1945 MHz. As demonstrated in FIG. 7B through FIG. 7D, spurious 60 in the samples 3A through 3C is further larger than that of the sample 1.

As described above, in the first comparative example, spurious 60 occurs at frequencies lower than the resonant frequency. When the second region 54 in which the pitch decreases at closer distances to the outer side is provided as with the second comparative example, spurious 60 is reduced as demonstrated by the samples 2A through 2C of the second comparative example of FIG. 6A through FIG. 6D. When the third regions 56 in which the pitch increases at closer distances to the outer side are provided outside the second regions 54 as with the first embodiment, spurious 60 is further reduced as demonstrated by the samples 4A through 4C of FIG. 6A through FIG. 6D.

When the pitch is increased at closer distances to the outer side in the second region 54 and the pitch is decreased at closer distances to the outer side in the third region 56 as with third comparative example, spurious 60 becomes larger than that of the first comparative example as demonstrated in FIG. 7A through FIG. 7D. As described above, when the direction in which the pitch is changed is made to be opposite to that of the first embodiment, spurious 60 becomes large.

In the first embodiment, as illustrated in FIG. 3B, the IDT 20 includes the first region 52, the second regions 54 located outside the first region 52 in the X direction, and the third regions 56 located outside the second regions 54 in the X direction. In the first region 52, the pitch P0 of the electrode fingers 21 is substantially constant. In the second region 54, the pitch of the electrode fingers 21 decreases at closer distances to the outer side. In the third region 56, the pitch of the electrode fingers 21 increases at closer distances to the outer side. This structure reduces spurious at frequencies lower than the resonant frequency as demonstrated in FIG. 5A through FIG. 7D. The pitch P0 in the first region 52 may differ by approximately 1% or less. The pitch P0 of the first region 52 is calculated by dividing the length of the first region 52 in the X direction by the number of pairs.

The first region 52 is preferably in contact with the second regions 54, and the second regions 54 are preferably in contact with the third regions 56. This structure further reduces spurious.

The pitch of the electrode fingers 21 closest to the first region 52 in the second region 54 is preferably equal to or less than the pitch P0 of the electrode fingers 21 in the first region 52. The pitch of the electrode fingers 21 closest to the second region 54 in the third region 56 is preferably equal to or greater than the pitch of the electrode fingers 21 closest to the third region 56 in the second region 54. This configuration enables to further reduce spurious.

Furthermore, the pitch of the electrode fingers 21 closest to the first region 52 in the second region 54 is substantially equal to the pitch P0 of the electrode fingers 21 in the first region 52 to the extent of a manufacturing error. The pitch of the electrode fingers 21 closest to the second region 54 in the third region 56 is substantially equal to the pitch of the electrode fingers 21 closest to the third region 56 in the second region 54 to the extent of a manufacturing error. This configuration enables to further reduce spurious.

Furthermore, the pitch of the outermost electrode fingers 21 in the third region 56 is substantially equal to the pitch P0 of the electrode fingers 21 in the first region 52 to the extent of a manufacturing error. This configuration enables to further reduce spurious.

In each of the second region 54 and the third region 56, the pitch changes at a constant rate. This configuration reduces spurious. When the pitch of the electrode fingers 21 is made to be changed at a constant rate, the widths of the electrode fingers 21 and the width of the gap between the electrode fingers 21 may be made to be uniform in a pair of the electrode fingers 21. Alternatively, the widths of the electrode fingers 21 and the width of the gap between the electrode fingers 21 may be made to be changed at a constant rate in a pair of the electrode fingers 21. The above simulation was conducted by changing the widths of the electrode fingers 21 and the width of the gap between the electrode fingers 21 at a constant rate in a pair of the electrode fingers 21.

As presented in FIG. 4D, the number of pairs in the second region 54 is equal to the number of pairs in the third region 56. This structure reduces spurious. The number of pairs in the second region 54 may differ from the number of pairs in the third region 56.

To reduce spurious, the pitch change rate in each of the second region 54 and the third region 56 is preferably 1% or greater, more preferably 3% or greater, and preferably 10% or less, more preferably 5% or less. The total number of pairs in both the second regions 54 is preferably 1% or more of, more preferably 3% or more of the number of pairs in the entire IDT, and preferably 10% or less of, more preferably 6% or less of the number of pairs in the entire IDT. The total number of pairs in both the third regions 56 is preferably 1% or more of, more preferably 3% or more of the number of pairs in the entire IDT, and is preferably 10% or less of, more preferably 6% or less of the number of pairs in the entire IDT. The pitch change rate in the second region 54 may be the same as or different from that in the third region 56. The pitch change rate in the third region 56 is preferably equal to or greater than 0.5 times and equal to or less than 2 times the pitch change rate in the second region 54.

The reflectors 24 are located outside the third regions 56 in the X direction. This structure reduces spurious. No IDT is preferably located between the third region 56 and the reflector 24.

The piezoelectric substrate 10 may be a lithium tantalate substrate or a lithium niobate substrate. The lithium tantalate substrate and the lithium niobate substrate are preferably a rotated Y-cut X-propagation substrate. For example, the lithium tantalate substrate is preferably a 36° to 48° rotated Y-cut X-propagation lithium tantalate substrate.

Variations of the First Embodiment

Figure 8A:
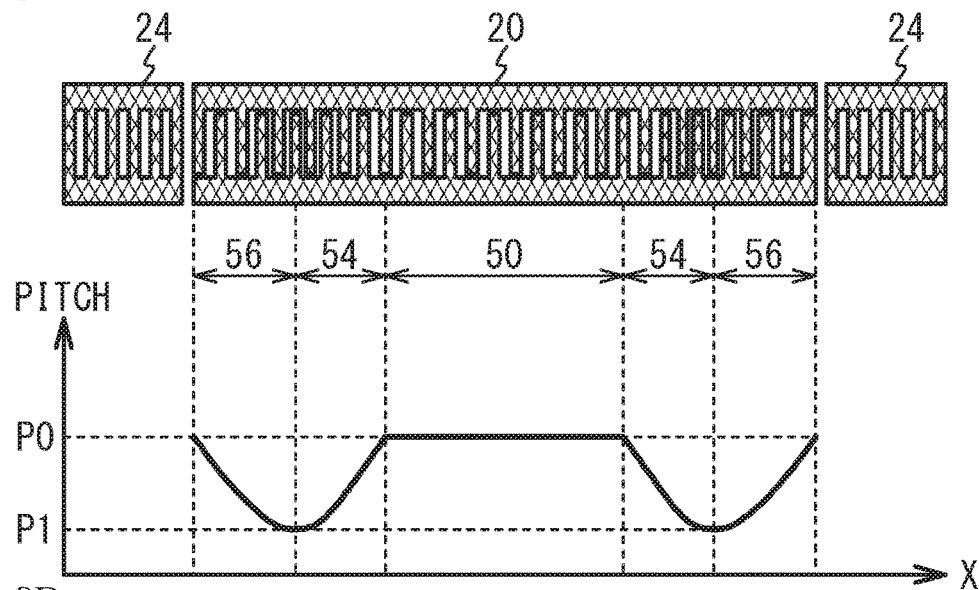
FIG. 8A through FIG. 8D illustrate the pitches of acoustic wave resonators in accordance with variations of the first embodiment in the X direction.
Figure 8B:
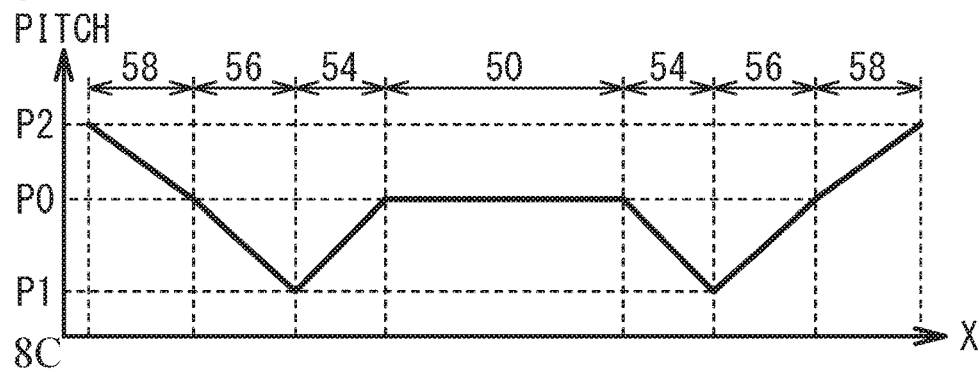

FIG. 8A through FIG. 8D illustrate the pitches of acoustic wave resonators in accordance with variations of the first embodiment in the X direction. As illustrated in FIG. 8A, in each of the second region 54 and the third region 56, the pitch may change curvedly with respect to X. As illustrated in FIG. 3B, the pitch may linearly change with respect to X. As illustrated in FIG. 8B, in a region 58 of the reflector 24, the pitch may increases from P0 to P2 at a constant rate at closer distances to the outer side. The pitch of the reflector 24 represents the distance between a pair of the electrode fingers as in the IDT 20.

Figure 8C:
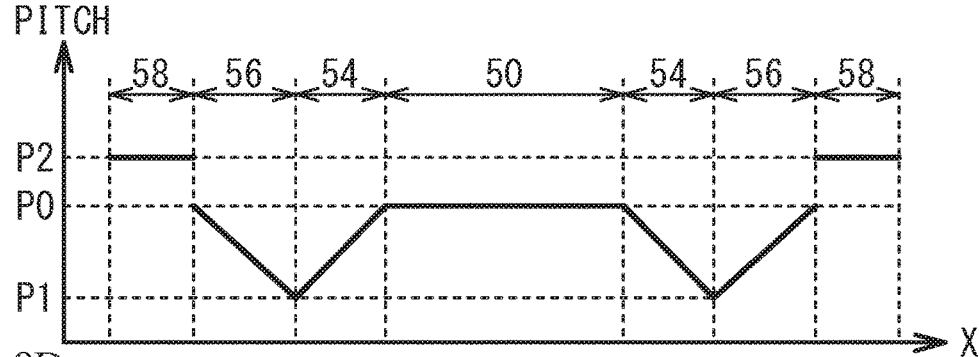
Figure 8D:
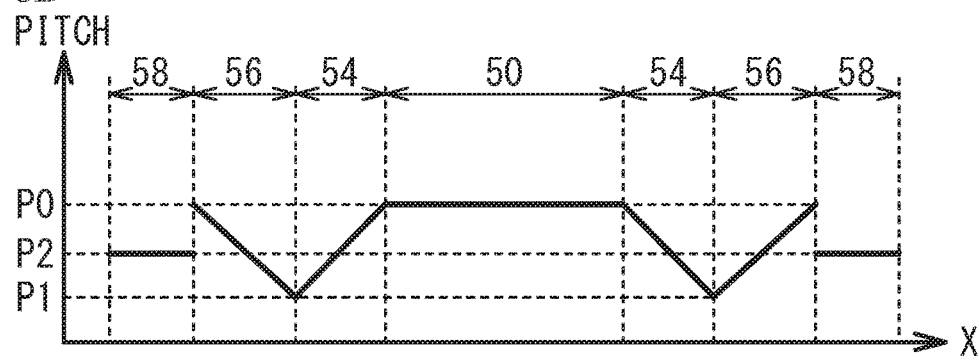

As illustrated in FIG. 8C, the pitch P2 in the reflector 24 may be greater than the pitch P0. As illustrated in FIG. 8D, the pitch P2 in the reflector 24 may be less than the pitch P0. The pitch P2 in the reflector 24 may be equal to the pitch P0. The pitch P2 in the reflector 24 may be greater than or less than the pitch P1.

Figure 9:
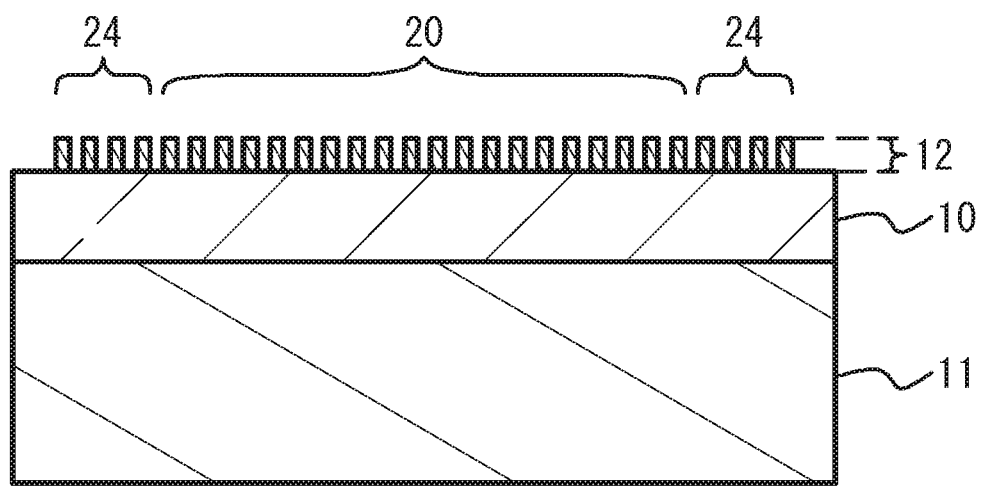
FIG. 9 is a cross-sectional view of an acoustic wave resonator in accordance with another variation of the first embodiment.

FIG. 9 is a cross-sectional view of an acoustic wave resonator in accordance with another variation of the first embodiment. As illustrated in FIG. 9, the piezoelectric substrate 10 may be bonded with the upper surface of a support substrate 11. The support substrate 11 is, for example, a sapphire substrate, an alumina substrate, a spinel substrate, or a silicon substrate.

Second Embodiment

Figure 10A:
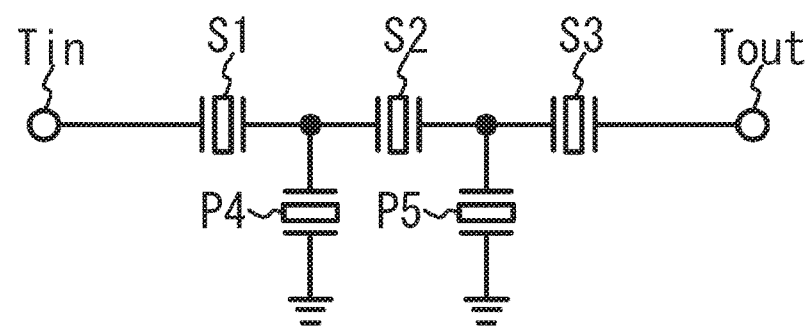
FIG. 10A is a circuit diagram of a filter in accordance with a second embodiment.
Figure 10B:
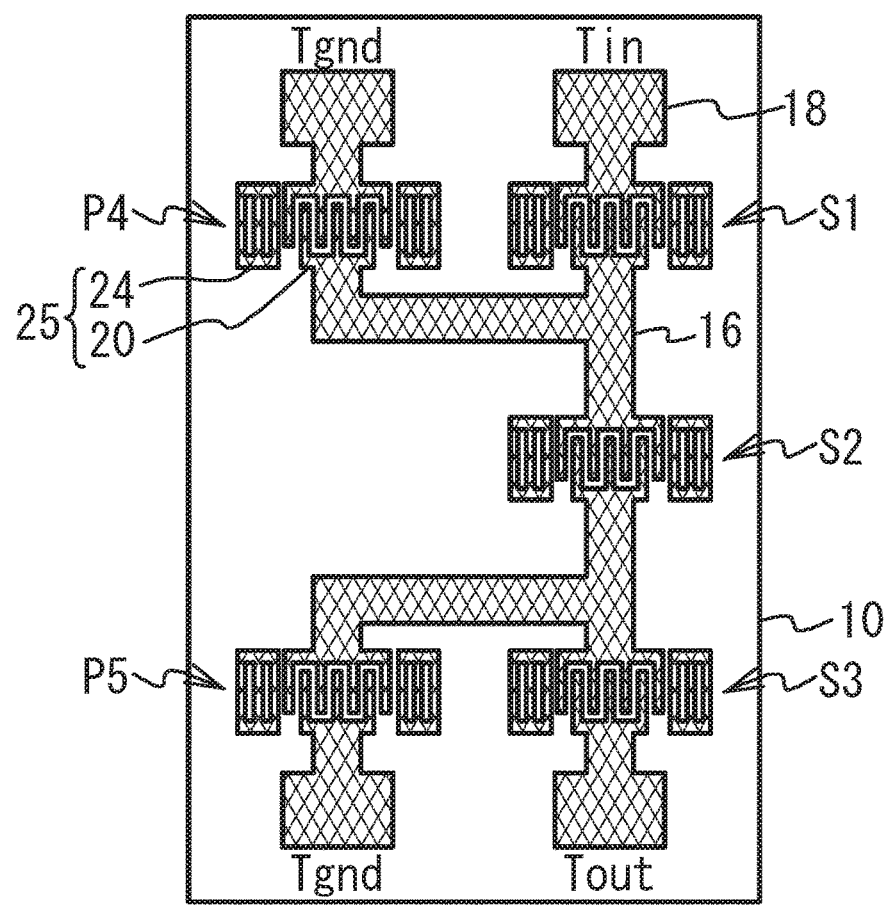
FIG. 10B is a plan view of the filter of the second embodiment.

FIG. 10A is a circuit diagram of a filter in accordance with a second embodiment, and FIG. 10B is a plan view of the filter in accordance with the second embodiment. As illustrated in FIG. 10A, between an input terminal Tin and an output terminal Tout, series resonators S1 through S3 are connected in series and parallel resonators P4 and P5 are connected in parallel.

As illustrated in FIG. 10B, located on the piezoelectric substrate 10 are surface acoustic wave resonators 25, wiring lines 16, and pads 18. The surface acoustic wave resonators 25 correspond to the series resonators S1 through S3 and the parallel resonators P4 and P5. The pads 18 correspond to the input terminal Tin, the output terminal Tout, and ground terminals Tgnd. The wiring lines 16 electrically connect between the surface acoustic wave resonators 25 and electrically connect the surface acoustic wave resonator 25 with the pad 18.

At least one of the surface acoustic wave resonators 25 of the filter of the second embodiment is made to be the acoustic wave resonator according to any one of the first embodiment and the variations thereof. This configuration reduces ripples due to spurious.

In the ladder-type filter such as the second embodiment, the passband is located in frequencies lower than the resonant frequency of the series resonators S1 through S3. Thus, at least one of the series resonators S1 through S3 is preferably the acoustic wave resonator according to any one of the first embodiment and the variations thereof. This configuration reduces ripples in the passband. All the series resonators S1 through S3 are preferably the acoustic wave resonators according to any one of the first embodiment and the variations thereof.

When at least two resonators of the series resonators Si through S3 are made to be the acoustic wave resonators according to any one of the first embodiment and the variations thereof, the pitch change rates in the respective second regions 54 may be made to be the same between the at least two resonators, and the pitch change rates in the respective third regions 56 may be made to be the same between the at least two resonators. Alternatively, between the at least two resonators, the pitch change rates and/or the numbers of pairs in the respective second regions 54 may be made to differ from one another, and/or the pitch change rates and/or the numbers of pairs in the respective third regions 56 may be made to differ from one another.

The number of series resonators and parallel resonators can be freely selected. It is sufficient if the ladder-type filter includes one or more series resonators and one or more parallel resonators.

First Variation of the Second Embodiment

Figure 11:
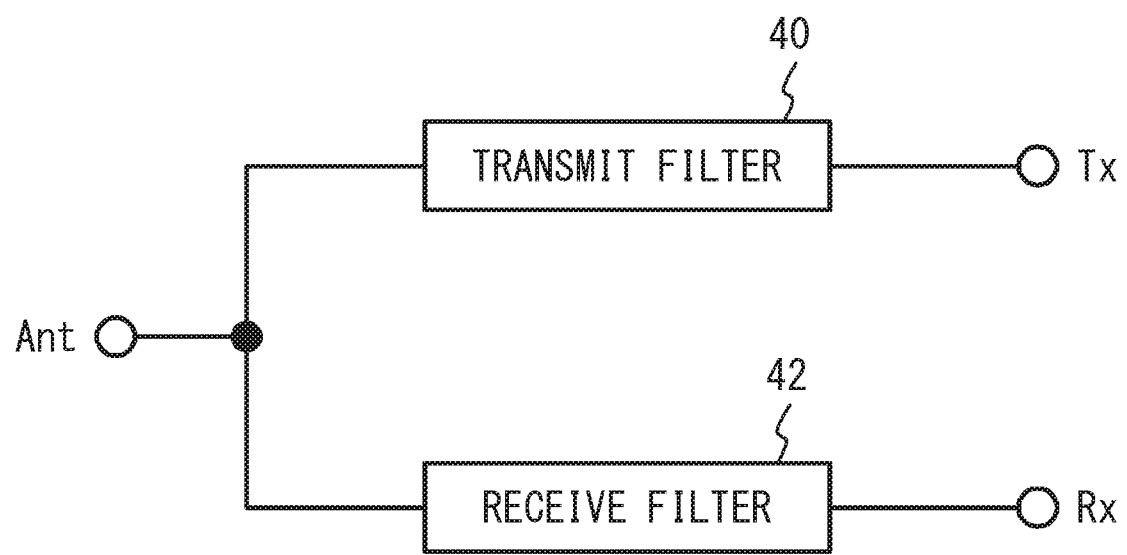
FIG. 11 is a circuit diagram of a duplexer in accordance with a first variation of the second embodiment.

FIG. 11 is a circuit diagram of a duplexer in accordance with a first variation of the second embodiment. As illustrated in FIG. 11, a transmit filter 40 is connected between a common terminal Ant and a transmit terminal Tx. A receive filter 42 is connected between the common terminal Ant and a receive terminal Rx. The transmit filter 40 transmits signals in the transmit band to the common terminal among high-frequency signals input from the transmit terminal Tx, and suppresses signals in other frequency bands. The receive filter 42 transmits signals in the receive band to the receive terminal among high-frequency signals input to the common terminal Ant, and suppresses signals in other frequency bands. At least one of the transmit filter 40 and the receive filter 42 may be the filter of the second embodiment. The duplexer has been described as an example of the multiplexer, but the multiplexer may be a triplexer, a quadplexer, or the like.

Although the embodiments of the present invention have been described in detail, it is to be understood that the various change, substitutions, and alterations could be made hereto without departing from the spirit and scope of the invention.

What is claimed is:

1. An acoustic wave resonator comprising:
    a piezoelectric substrate;
    an interdigital transducer (IDT) located on the piezoelectric substrate, the IDT including a pair of comb-shaped electrodes having a plurality of electrode fingers and a bus bar to which the plurality of electrode fingers are coupled, the IDT having: a first region in which a pitch of electrode fingers is substantially constant; a second region in which a pitch of electrode fingers decreases at closer distances to an outer side; and a third region in which a pitch of electrode fingers increases at closer distances to an outer side, the second region being located outside the first region in an arrangement direction of the plurality of electrode fingers, and the third region being located outside the second region in the arrangement direction; and
    a reflector located on the piezoelectric substrate and located outside the IDT in the arrangement direction,
    wherein a region in which a pitch of electrode fingers is substantially constant is not located between the third region and the reflector.

2. The acoustic wave resonator according to claim 1, wherein
    the first region is in contact with the second region, and the second region is in contact with the third region.

3. The acoustic wave resonator according to claim 1, wherein
    a pitch of electrode fingers closest to the first region in the second region is equal to or less than the pitch of the electrode fingers in the first region;
    a pitch of electrode fingers closest to the second region in the third region is equal to or less than a pitch of electrode fingers closest to the third region in the second region.

4. The acoustic wave resonator according to claim 1, wherein the pitch changes at a constant rate in each of the second region and the third region.

5. The acoustic wave resonator according to claim 1, wherein
a number of the electrode fingers in the second region is equal to a number of the electrode fingers in the third region.

6. The acoustic wave resonator according to claim 1, wherein
the piezoelectric substrate is a lithium tantalate substrate or a lithium niobate substrate.

7. A filter comprising:
an acoustic wave resonator including:
a piezoelectric substrate;
an interdigital transducer (IDT) located on the piezoelectric substrate, the IDT including a pair of comb-shaped electrodes having a plurality of electrode fingers and a bus bar to which the plurality of electrode fingers are coupled, the IDT having: a first region in which a pitch of electrode fingers is substantially constant; a second region in which a pitch of electrode fingers decreases at closer distances to an outer side; and a third region in which a pitch of electrode fingers increases at closer distances to an outer side, the second region being located outside the first region in an arrangement direction of the plurality of electrode fingers, and the third region being located outside the second region in the arrangement direction; and
a reflector located on the piezoelectric substrate and located outside the IDT in the arrangement direction,
wherein a region in which a pitch of electrode fingers is substantially constant is not located between the third region and the reflector.

8. The filter according to claim 7, further comprising:
one or more series resonators connected in series between an input terminal and an output terminal; and
one or more parallel resonators connected in parallel between the input terminal and the output terminal, wherein
at least one of the one or more series resonators is the acoustic wave resonator.

9. A multiplexer comprising:
a filter including an acoustic wave resonator, wherein the acoustic wave resonator includes:
a piezoelectric substrate;
an interdigital transducer (IDT) located on the piezoelectric substrate, the IDT including a pair of comb-shaped electrodes having a plurality of electrode fingers and a bus bar to which the plurality of electrode fingers are coupled, the IDT having: a first region in which a pitch of electrode fingers is substantially constant; a second region in which a pitch of electrode fingers decreases at closer distances to an outer side; and a third region in which a pitch of electrode fingers increases at closer distances to an outer side, the second region being located outside the first region in an arrangement direction of the plurality of electrode fingers, and the third region being located outside the second region in the arrangement direction; and
a reflector located on the piezoelectric substrate and located outside the IDT in the arrangement direction,
wherein a region in which a pitch of electrode fingers is substantially constant is not located between the third region and the reflector.

10. The acoustic wave resonator according to claim 1, wherein:
the reflector is provided in a pair, and the pair of reflectors are located on both outer sides of the IDT in the arrangement direction,
the second region is provided in a pair, and one of the pair of second regions is located between the first region and one of the pair of reflectors, and anther of the pair of second regions is located between the first region and another of the pair of reflectors,
the third region is provided in a pair, and one of the pair of third regions is located between the one of the pair of second regions and the one of the pair of reflectors, and anther of the pair of third regions is located between the another of the pair of second regions and the another of the pair of reflectors,
a difference between a pitch of the electrode fingers closest to the first region in the one of the pair of second regions and a pitch of the electrode fingers closest to the one of the pair of third regions in the one of the pair of second regions is equal to a difference between a pitch of the electrode fingers closest to the first region in the another of the pair of second regions and a pitch of the electrode fingers closest to the another of the pair of third regions in the anther of the pair of second regions, and
a difference between a pitch of the electrode fingers closest to the one of the pair of second regions in the one of the pair of third regions and a pitch of the electrode fingers closest to the one of the pair of reflectors in the one of the pair of third regions is equal to a difference between a pitch of the electrode fingers closest to the another of the pair of the second regions in the another of the pair of third regions and a pitch of the electrode fingers closest to the another of the pair of reflectors in the anther of the pair of third regions.

* * * * *